United States Patent [19]

Logan

[11] Patent Number: 5,534,826
[45] Date of Patent: Jul. 9, 1996

[54] OSCILLATOR WITH INCREASED RELIABILITY START UP

[75] Inventor: Shawn M. Logan, Andover, Mass.

[73] Assignee: AT&T Corp., Murray Hill, N.J.

[21] Appl. No.: 327,778

[22] Filed: Oct. 24, 1994

[51] Int. Cl.$^6$ .............................. H03B 5/06; H03B 5/36; H03K 3/014
[52] U.S. Cl. ................ 331/158; 331/36 C; 331/116 FE; 331/173; 331/177 V
[58] Field of Search ............................... 331/4, 14, 36 C, 331/116 R, 116 FE, 117 R, 117 FE, 158, 173, 177 R, 177 V, 172

[56] References Cited

U.S. PATENT DOCUMENTS

| | | | |
|---|---|---|---|
| 3,619,803 | 11/1971 | Klein | 331/8 |
| 4,039,973 | 8/1977 | Yamashiro | 331/158 X |
| 4,282,496 | 8/1981 | Heuner | 331/116 FE |
| 4,307,354 | 12/1981 | Miyagawa et al. | 331/116 FE |
| 4,517,533 | 5/1985 | Bretl | 331/158 X |
| 4,518,930 | 5/1985 | Rozema et al. | 331/116 R X |
| 4,667,170 | 5/1987 | Lofgren et al. | 331/177 V X |
| 4,675,617 | 6/1987 | Martin | 331/1 A |
| 4,704,587 | 11/1987 | Ouyang et al. | 331/116 FE |
| 4,743,864 | 5/1988 | Nakagawa et al. | 331/14 X |
| 4,748,425 | 5/1988 | Heck | 331/177 V X |
| 4,853,655 | 8/1989 | Embree et al. | 331/116 |
| 4,887,053 | 12/1989 | Embree et al. | 331/116 |
| 4,896,122 | 1/1990 | Tahernia et al. | 331/158 |
| 4,918,408 | 4/1990 | Sakihama et al. | 331/116 FE X |
| 4,973,922 | 11/1990 | Embree et al. | 331/108 |
| 5,041,802 | 8/1991 | Wei et al. | 331/158 X |
| 5,142,251 | 8/1992 | Boomer | 331/116 FE |
| 5,175,884 | 12/1992 | Suarez | 331/177 V X |
| 5,334,954 | 8/1994 | Koblitz et al. | 331/14 X |
| 5,359,297 | 10/1994 | Hodel et al. | 331/1 A |
| 5,410,572 | 4/1995 | Yoshida | 331/14 X |

OTHER PUBLICATIONS

"The Current Dependency of Crystal Unit Resistance at Low Drive Level" Proceedings of the 25th Annual Symposium on Frequency Control Apr. 26–28, 1971, U.S. Army Electronics Command, Fort Monmouth, New Jersey pp. 139–147. Nonaka et al.

"A Simple Model for Quartz Resonator Low Level Drive Sensitivity" Forty–Fifth Annual Symposium on Frequency Control, L. Dworsky and R. Kinsman, Motorola, Inc. IEEE 1991, pp. 148–155.

*Primary Examiner*—David Mis
*Attorney, Agent, or Firm*—Eugene S. Indyk

[57] ABSTRACT

Oscillation is easily and reliably initiated in an oscillator by increasing the gain of the circuit at startup time. For example, the gain of an oscillator circuit may be increased at startup by reducing the value of a user controlled impedance until oscillation commences. Alternatively, or in combination, the input impedance of an amplifier used in the oscillator may be reduced at startup to facilitate the initiation of oscillation.

17 Claims, 2 Drawing Sheets

Technique to Increase Voltage Controllable Oscillator Gain During Oscillator Start-Up Voltage to Reactance Element

OSCILLATOR WITH INCREASED RELIABILITY START UP

TECHNICAL FIELD

This disclosure relates to oscillators. More particularly, this disclosure relates to oscillators with reliable start up.

BACKGROUND

A key factor in oscillator design is the ease with which oscillation may be initiated. Some oscillators have serious reliability problems in this regard because certain of their characteristics change as a function of drive level. For example, in oscillators, such as quartz based oscillators, the effective resistance of the resonators used in those oscillators is much higher at low power levels than at high power levels. These drive level sensitive resonators are often subjected to the lowest power level during the turn on period of the oscillator when power is first applied. Oscillators with a drive level sensitive resonator, therefore, may not start when power is applied because the oscillator circuit cannot overcome a large resonator resistance seen at the low power level experienced at start up. This effect is not even stable with time. For example, an oscillator with a drive level sensitive resonator may start initially, but may fail to start at some future time. Start up problems such as these have been a long standing and pervasive problem in the oscillator industry and a great deal of effort has been focused on eliminating the problems associated with drive level sensitive resonators. To date, there are no known techniques to satisfactorily eliminate all root causes or problems associated with drive level sensitive resonators in oscillation circuitry.

SUMMARY

Applicant has realized that increasing the gain of an oscillator, such as a voltage controllable quartz crystal oscillator, during start up will significantly enhance the likelihood that the oscillator can be successfully induced to oscillate when a reasonable amount of power is applied to the oscillator. In the case of a voltage controllable quartz crystal oscillator, the gain of the oscillator circuit is a strong function of a user applied control voltage used to set the output frequency of the oscillator. In general, a user may apply any signal level to a control input during the start up period of the oscillator, including a signal level where the oscillator has its minimum gain. Applicant has increased turn on reliability by forcing the oscillator to turn on in a configuration where maximum possible oscillator gain is in place, independent of a user supplied control voltage signal level. A circuit associated with the oscillator detects steady state oscillation on the output of the oscillator after power up and then allows the oscillator to be set in accordance with the user applied signal once oscillation begins. Since the power level to the resonator is no longer low, its resistance now is typically very low and the oscillator continues to reliably operate over the full range of the user applied control voltage input.

This summary is meant merely to reflect one or more examples of the invention. The full scope of exclusionary right conferred by patent is defined in the claims.

DETAILED DESCRIPTION

Figure 1:
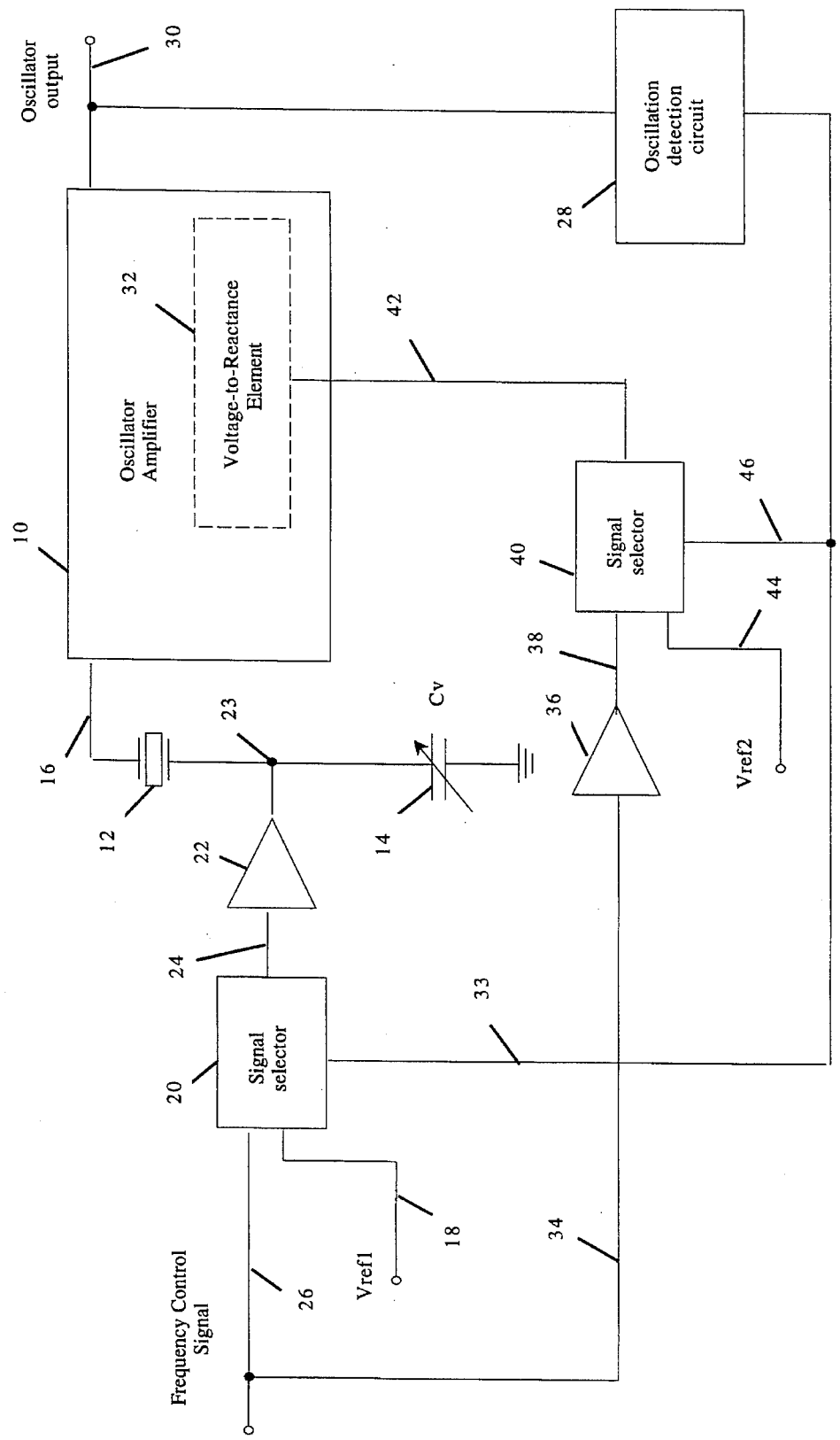
FIG. 1 is a schematic diagram of one example of an oscillator circuit in accordance with this invention.

FIG. 1 shows an example of a voltage controlled oscillator in accordance with this invention. The oscillator comprises an amplifier section 10 and a resonator section comprising a piezoelectric quartz crystal resonator element 12 in series with a varactor 14. The series combination of the resonator element 12 and the varactor 14 is connected to the input 16 of the amplifier section 10. The impedance of the series combination in conjunction with the input impedance of the amplifier section 10 determines the frequency of oscillation of the circuit of FIG. 1. The level of a user specified frequency control signal determines the capacitance of the varactor 14 via the amplifier 22 and thus the oscillation frequency of the circuit of FIG. 1. Examples of such voltage controlled oscillators are disclosed in U.S. Pat. Nos. 4,853,655 and 4,887,053. An example of a suitable varactor is shown in U.S. Pat. No. 4,973,922.

It may not be easy to reliably induce oscillation in such voltage controlled oscillators. Applicant has determined that this is because the oscillator has a low gain during start up conditions, which is caused by a high resonator resistance at low power levels. The problem of low gain at startup is aggravated by the impedance of the varactor 14 in series with the resonator 12. Since the capacitance of the varactor 14 varies as a function of the voltage magnitude at junction 23, which may reflect the magnitude of the user applied frequency controlled signal on line 26, and not an ideal magnitude to promote initiation of oscillation, the conditions for reliable startup may be reduced. To solve this problem, the oscillator of FIG. 1 includes a reference signal on line 18 which has a predetermined magnitude representing a commanded value of varactor impedance which will increase the gain of the oscillator circuit in FIG. 1. The reference signal is connected to the input of a signal selection element 20, the output of which is connected to the input of an amplifier 22 by way of a line 24. The amplifier provides a predetermined amount of amplification or attenuation of signals appearing on line 24. The output of the amplifier 22 is connected to the junction 23 between the resonator element 12 and the varactor 14. The voltage level of the junction 23 is thus determined by the voltage magnitude at the output of the amplifier 22 which in turn is determined by the level of the reference signal. The capacitance of the varactor 14 varies as a function of the voltage magnitude at junction 23 and thus varies as a function of reference voltage level.

Another input to the signal selection element 20 is the previously mentioned frequency control signal appearing on line 26. A user sets the magnitude of the frequency control signal on line 26. When the frequency control signal is selected by the selection element 20, the magnitude of the frequency control signal determines the impedance of the varactor 14 which in turn determines the oscillation frequency of the FIG. 1 circuit. In the past, the frequency of oscillation was determined solely by the frequency control signal set by the user. The magnitude of the frequency control signal and thus the magnitude of the capacitance of the varactor 14 can vary over fairly wide ranges. If the magnitude of the frequency control signal of line 26 is such that the impedance of the varactor 14 is high, the gain of the FIG. 1 oscillator circuit will be low and it will be difficult to reliably initiate oscillation in such a circuit. To insure that the impedance of the varactor 14 is at a suitable value for reliably initiating oscillation, the voltage reference signal on line 18, which has an appropriate magnitude so that the varactor 14 will have an impedance low enough for reliable initiation of oscillation, is substituted for the frequency control signal on line 26 during oscillator startup. Specifically, the signal selection element 20 operates to direct the voltage reference signal on line 18 to the input of amplifier 22 during oscillator startup. The voltage magnitude at node 23 thus is a function of the magnitude of the voltage reference signal on line 18 during startup. The impedance of the varactor 14 thus is set at a magnitude promoting reliable startup of the oscillator. For example, the impedance of the varactor 14 is such that it has a maximum capacitance and thus a minimum impedance. Once oscillation has begun in the circuit of FIG. 1, the signal selection element 20 then substitutes the frequency control signal on line 26 for the voltage reference signal on line 18 as an input to the amplifier 22 and node 23. The oscillator frequency will then be controlled by the magnitude of the frequency control signal as selected by the user.

Oscillation of the FIG. 1 circuit is detected by an oscillation detection circuit 28 connected to the oscillator output 30. The output of the detection circuit 28 is connected to a control input 33 of the signal selection element 20. Before oscillation is detected on the output 30, the output of the detection circuit 28 commands the signal selection element 20 to direct the voltage reference signal to the input of the amplifier 22. Once oscillation has commenced, the detection circuit 28 commands the signal selection element 20 to direct the frequency control signal to the input of amplifier 22.

Any circuit capable of detecting or signaling the presence of oscillation on output 30 is suitable for use in the circuit of FIG. 1. For example, the oscillation detection circuit 28 may be a high pass filter having an input connected to output 30 and producing a dc output in substantially direct proportion to the frequency of electrical signal on output 30. The dc output can then be compared to a threshold level in a comparator circuit which produces an output signal directed to the output of the detection circuit 28 when the dc output is above the threshold thereby indicating the presence of oscillations on the output of the circuit of FIG. 1.

Any circuit capable of selectively producing a signal on its output related to one or the other of the frequency control signal on line 26 or the reference signal on line 18 in response to a control input on line 33 is suitable for use as a signal selection element 20 in FIG. 1. For example, the signal selection element may be an analog multiplexer.

In the example of the invention shown in FIG. 1, the frequency of oscillation is determined not only by the impedance of the varactor 14, but also by the input impedance of the oscillator amplifier section 10. Specifically, the circuit of FIG. 1 will oscillate if the sum of the real part of the input impedance of the amplifier section 10 and the real part of the resonator impedance comprising element 12 and varactor 14 is less than zero. In the steady state, the sum of the real and imaginary parts of the input impedance of amplifier section 10, the impedance of resonator element 12, and varactor 14 is zero. By changing the input impedance of the amplifier section 10, the impedance of the resonator element 12 produces a change in oscillation frequency since the sum of the impedances of amplifier section 10, resonator element 12, and varactor 14 must remain at zero in the steady state. Hence, the frequency of oscillation may be changed by changing the input impedance of amplifier section 10. The gain of the circuit of FIG. 1 also is determined by the magnitude of the input impedance of the amplifier section 10. The reliability of oscillator startup may also be improved if the real part of the input impedance of the amplifier is lowered, for example, is made more negative, at startup time. In the circuit of FIG. 1 the input impedance of amplifier section 10 is determined by an input impedance determining element, such as the voltage to reactance element 32. The voltage to reactance element 32 is controlled at oscillator startup so that the amplifier has an input impedance resulting in a high enough gain so that the oscillator easily goes into oscillation.

The frequency control signal is directed on a line 34 to the input of an amplifier 36, which provides a predetermined amplification or attenuation of the signal appearing on line 34. The output of the amplifier 36 is connected to an input line 38 of a signal selection element 40. When the circuit of FIG. 1 is oscillating, the frequency control signal is connected to an input 42 of the voltage to reactance element 32 by the signal selection element 40. The frequency control signal thus controls the oscillation frequency of the circuit of FIG. 1 after oscillation has been initiated. At startup, however, the value of the frequency control signal may be such that the voltage to reactance element 32 will cause a relatively high input impedance in the oscillator amplifier section 10 and, therefore, will result in a relatively low gain for the circuit of FIG. 1, which will make it difficult to initiate oscillatory behavior. To promote the initiation of oscillation in the circuit of FIG. 1, another voltage reference signal is directed on line 44 to another input of the signal selection element 40. The signal selection element 40 directs this voltage reference signal on line 44 to the voltage to reactance element 32 during startup. The magnitude of the voltage reference signal on line 44 is such that the voltage to reactance element 32 is set to result in an input impedance of the oscillator amplifier section 10 which will produce sufficient gain in the circuit of FIG. 1 for reliable initiation of oscillation. The frequency control signal from line 34 is substituted for the voltage reference signal on line 44 once oscillation begins, as detected by the oscillation detection circuit 28 whose output controls the selection made by the signal selection element 40 by way of a control line 46.

Similar to the selection element 20, any circuit capable of selectively producing a signal on its output related to one or the other of the signal on line 38 or the reference signal on line 44 in response to a control input on line 46 is suitable for use as a signal selection element 40 in FIG. 1. For example, the signal selection element may be an analog multiplexer.

Figure 2:
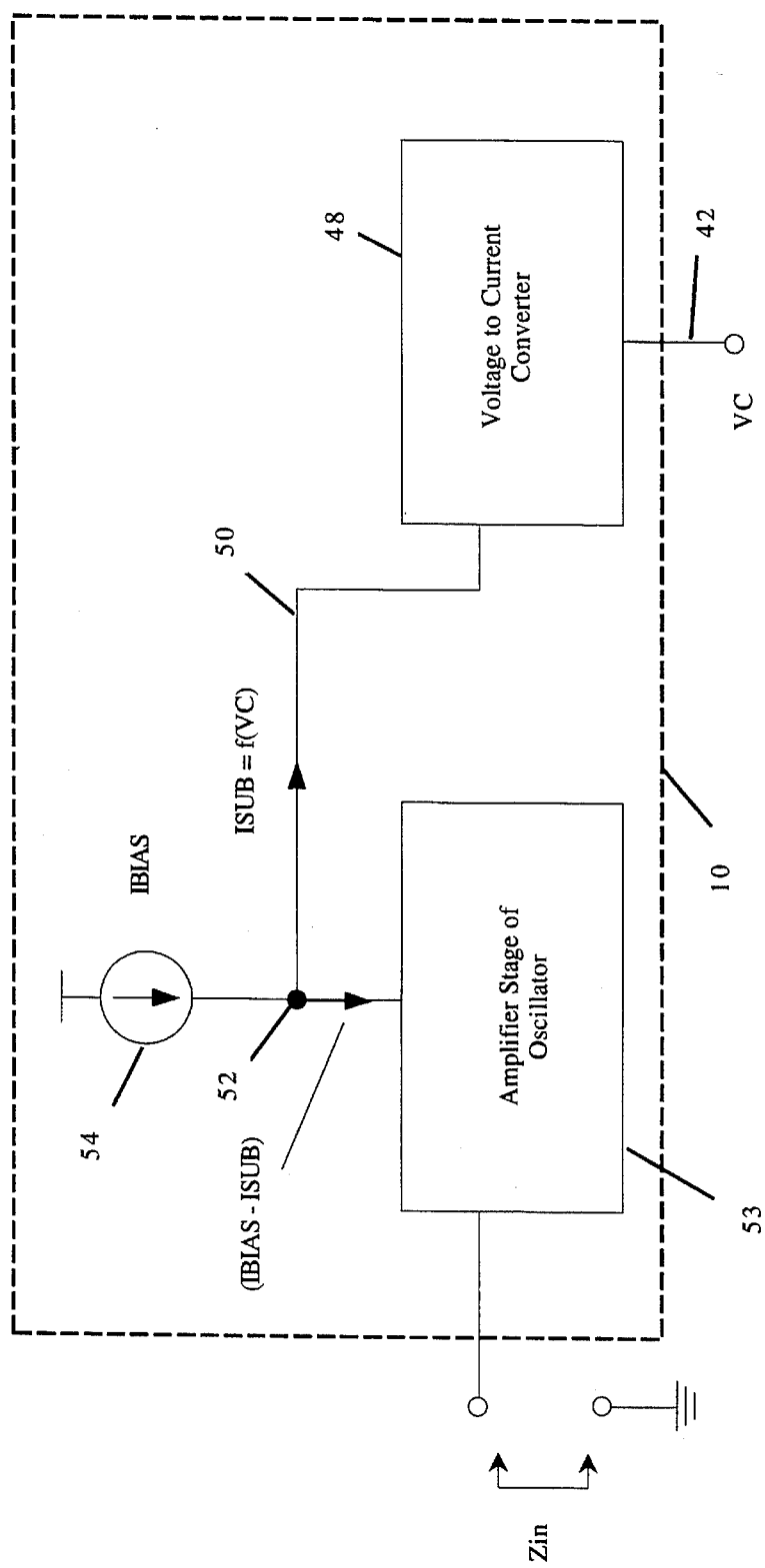
FIG. 2 is a schematic diagram of an example of an implementation of the voltage to reactance element shown in FIG. 1.

Any element capable of influencing the amplification stage 10 so as to provide enough gain at startup to insure reliable initiation of oscillation may be used as the element 32 in the circuit of FIG. 1. For example, as shown in FIG. 2, the frequency control signal used during oscillation and the reference signal used at startup may control a bias current in the amplification stage 10 to provide the required gain. In FIG. 2, the signal on line 42, which is the same as the signal on line 42 in FIG. 1, is directed to an input of a voltage to current converter 48 which produces a current output on line 50 which is related to the magnitude of the signal on line 42, for example, a current output which is substantially proportional to the input on line 42. The current on line 50 is either added to or subtracted from a node 52 in the amplification stage 10, as needed. The node 52 also receives bias current from a constant current source 54. The actual level of bias current in the amplification stage 10 thus is the bias current from source 54 modified by the current produced by the voltage to current converter 48. The gain of the amplification stage 10 thus is controlled as a function of frequency control signal on line 34 or voltage reference signal on line 44 to provide increased gain for the circuit of FIG. 1 during startup to insure reliable initiation of oscillation. Although the examples of the invention shown in FIGS. 1 and 2 are shown as involving the control of the varactor 5 and the amplifier input impedance determining element 32 by the same control signal, they may also be controlled by different control signals.

The initiation of oscillation in an oscillator circuit such as the one shown in FIG. 1 thus may be facilitated by techniques which increase the gain of the circuit during startup conditions. One or both of the impedance of a resonator circuit or the input impedance of an amplifier used in the oscillator may be controlled to predetermine magnitudes during startup to achieve this increase in gain.

I claim:

1. An oscillator, comprising;
   at least one controllable element which sets the operating frequency of the oscillator in response to a control signal;
   a means for detecting onset of oscillation of the oscillator;
   a means responsive to the detecting means for setting a value of the control signal which insures that the oscillator will oscillate when it is turned on.

2. The oscillator of claim 1, in which the controllable element comprises a impedance in an resonator section.

3. The oscillator of claim 1, in which the controllable element comprises an element which determines an amplifier input impedance.

4. The oscillator of claim 1 in which the controllable element comprises a impedance in a resonator section and an element in an amplifier section which determines an input impedance.

5. An oscillator, comprising:
   a resonator section comprising a user controlled impedance;
   an amplifier section having an input impedance, the amplifier being responsive to the resonator section for producing an oscillatory output signal of a predetermined frequency;
   an input for receiving a frequency control signal which determines the predetermined frequency by varying the user controlled impedance in accordance with the magnitude of the frequency control signal;
   an input for receiving a reference signal representing a level of gain which will insure initiation of oscillation;
   a circuit for detecting an oscillatory output signal from the amplifier section; and
   a signal selection element responsive to the frequency control input, the reference signal input, and the detecting circuit for enabling the reference signal to control the user controlled impedance during oscillator startup and for enabling the frequency control signal to control the user controlled impedance once an oscillatory output is detected by the detecting circuit.

6. The oscillator of claim 5, further comprising:
   another input for receiving a frequency control signal which determines the predetermined frequency by varying the input impedance of the amplifier in accordance with the magnitude of the frequency control signal;
   another input for receiving a reference signal representing a level of input impedance which will insure initiation of oscillation; and
   a signal selection element responsive to the another frequency control input, the another reference signal input, and the detecting circuit for enabling the reference signal to control the input impedance of the amplifier section during oscillator startup and for enabling the frequency control signal to control the input impedance of the amplifier section once an oscillatory output is detected by the detecting circuit.

7. An oscillator, comprising:
   a resonator section comprising a user controlled impedance;
   an amplifier section having an input impedance, the amplifier section being responsive to the resonator section for producing an oscillatory output of predetermined frequency;
   an input for receiving a frequency control signal which determines the predetermined frequency by varying the input impedance of the amplifier section in accordance with the magnitude of the frequency control signal;
   an input for receiving a reference signal representing a level of input impedance which will insure initiation of oscillation;
   a circuit for detecting an oscillatory output signal from the amplifier; and
   a signal selection element responsive to the frequency control input, the reference signal input, and the detecting circuit for enabling the reference signal to control the input impedance of the amplifier during oscillator startup and for enabling the frequency control signal to control the input impedance of the amplifier once an oscillatory output is detected by the detecting circuit.

8. A method of controlling an oscillator, comprising the step of:
   substituting a reference signal for a frequency control signal at oscillator startup, the reference signal representing an oscillator gain of a sufficient magnitude to reliably initiate oscillation and the frequency control signal representing a user commanded frequency of oscillation.

9. The method of claim 8, further comprising the step of:
   substituting the frequency control signal for the reference signal when oscillation has commenced.

10. A method of controlling an oscillator, comprising the steps of:
    detecting oscillation;
    applying a user defined frequency control signal to the oscillator when oscillation is detected to control an oscillation frequency as a function of the frequency control signal; and
    applying a reference signal to the oscillator when no oscillation is detected to increase a gain parameter of the oscillator to facilitate initiation of oscillation.

11. The method of claim 10, in which the gain parameter is determined by an impedance value of a resonator circuit.

12. The method of claim 11, in which the impedance value is associated with a varactor.

13. The method of claim 11, in which the impedance value is associated with an input impedance of an amplifier in the oscillator.

14. The method of claim 12 in which the impedance value is associated with an input impedance of an amplifier in the oscillator in addition to the impedance of the varactor.

15. A voltage controlled oscillator, comprising:
    an amplifier section;
    a resonator section comprising a crystal resonator in series with a varactor, the resonator section being connected to an input of the amplifier section;

a first input for receiving a frequency control voltage representing a commanded oscillation frequency;

a second input for receiving a voltage reference signal representing a predetermined gain associated with the oscillator insuring reliable initiation of oscillation;

a detector of oscillation in the oscillator;

a switching element responsive to the detector for connecting the first input to the varactor when oscillation is detected and for connecting the second input to the varactor when no substantial oscillation is detected by the detector.

16. A voltage controlled oscillator, comprising:

an amplifier section having an element defining an input impedance of the amplifier section;

a resonator section connected to an input of the amplifier section;

a first input for receiving a frequency control voltage representing a commanded oscillation frequency;

a second input for receiving a voltage reference signal representing a predetermined gain associated with the oscillator insuring reliable initiation of oscillation;

a detector of oscillation in the oscillator;

a switching element responsive to the detector for connecting the first input to the input impedance defining element in the amplifier section when oscillation is detected and for connecting the second input to the input impedance defining element when no substantial oscillation is detected.

17. A voltage controlled oscillator, comprising:

an amplifier section having an element defining an input impedance of the amplifier section;

a resonator section comprising a crystal resonator in series with a varactor, the resonator section being connected to an input of the amplifier section;

a first input for receiving a first frequency control signal representing a commanded oscillation frequency;

a second input for receiving a first voltage reference signal representing a first predetermined gain associated with the oscillator;

a detector of oscillation in the oscillator;

a first switching element responsive to the detector for connecting the first input to the input impedance defining element in the amplifier section when substantial oscillation is detected and for connecting the second input to the input impedance defining element when no substantial oscillation is detected;

a third input for receiving a second frequency control signal representing a commanded oscillation frequency;

a fourth input for receiving a second voltage reference signal representing a second predetermined gain associated with the oscillator; and a second switching element responsive to the detector for connecting the third input to the varactor when substantial oscillation is detected and for connecting the fourth input to the varactor when no substantial oscillation is detected.

* * * * *